United States Patent [19]

Dustmann et al.

[11] 4,178,676

[45] Dec. 18, 1979

[54] METHOD FOR TREATING A SUPERCONDUCTOR

[75] Inventors: Cord-Henrich Dustmann, Leopoldshafen; Curt Schmidt, Karlsruhe; Gabriel Pasztor, Eggenstein-Leopoldshafen, all of Fed. Rep. of Germany

[73] Assignee: Kernforschungszentrum Karlsruhe GmbH, Karlsruhe, Fed. Rep. of Germany

[21] Appl. No.: 902,907

[22] Filed: May 5, 1978

[30] Foreign Application Priority Data

May 5, 1977 [DE] Fed. Rep. of Germany ....... 2720119

[51] Int. Cl.² ............................................. H01L 39/24
[52] U.S. Cl. ................................. 29/599; 29/602 R; 148/129; 148/133; 335/216; 336/DIG. 1
[58] Field of Search ................. 29/602, 599, 605, 607; 335/216; 336/DIG. 1; 148/125, 128, 120, 133, 122, 129

[56] References Cited

U.S. PATENT DOCUMENTS

| | | | |
|---|---|---|---|
| 3,571,922 | 3/1971 | Schweitzer et al. | 29/599 |
| 3,953,922 | 5/1976 | Heim | 148/133 X |

*Primary Examiner*—Francis S. Husar
*Assistant Examiner*—V. K. Rising
*Attorney, Agent, or Firm*—Spencer & Kaye

[57] ABSTRACT

A method of making a superconducting coil from a superconducting wire includes the step of winding the wire to form a coil. Prior to the winding step, the wire is submitted to repeated tension-stressing of a predetermined stretch and a predetermined number of cycles, in order to reduce the "training" of the superconducting coil.

3 Claims, 3 Drawing Figures

METHOD FOR TREATING A SUPERCONDUCTOR

BACKGROUND OF THE INVENTION

This invention relates to a method of treating a superconducting wire for the purpose of reducing the number of training steps performed on the coil made from the superconducting wire and an apparatus for performing such a method on wires of small and large lengths.

For generating powerful magnetic fields, it has become increasingly frequent to use coils which have superconducting properties at predetermined low temperatures and thus have no electric resistance in that condition. In such an arrangement substantially higher current intensities may be realized than in normally conducting conductors and the energy losses may be reduced to a substantial extent.

If, however, during operation involving such superconducting coils, there occurs an unintended transition from the superconducting state to the normally conducting state, then, due to the substantially higher specific resistance of the superconducting material in the normal conducting state, the resulting abruptly increasing heat losses may lead to a heat-caused destruction of the conductor. Such an occurrence is conventionally prevented by dividing the superconductors into a plurality of filaments which are embedded into a matrix made of normally conducting material such as copper. When a coil made of superconductors structured in this manner is loaded with current for the first time, a transition into the normal conducting condition may occur at a certain current load which is below the critical current intensity of the wire. Upon repeating several times this loading process, the current intensity is increased in a step-wise manner up to the critical current intensity. Thus, a phenomenon occurs which is comparable to a training effect. This phenomenon can be observed in particular in partially stabilized NbTi superconductors. The reason for this phenomenon is seen in a stress-induced microplastic deformation or shape memory efforts in NbTi, the intensity of which may be reduced by means of a pretreatment of the superconductor.

It is known to perform the above-outlined training of a superconducting coil for setting the highest possible critical current intensity by submitting the magnetic coil, to a greater or lesser number of transitions into the normally conducting state. The disadvantages of such a process reside particularly in the fact that as the size of the magnetic coil increases, the number of the necessary training steps and the period required for the individual training steps increase rapidly.

Further, a process is also known—as disclosed in U.S. Pat. No. 3,953,922—wherein a sleeve or a pin is inserted in the air core of the coil, or a coaxial ring is cylindrically arranged about the coil and by heating and/or cooling, heat-caused stresses are transmitted from such an auxiliary arrangement to the coil. It is a significant disadvantage of this arrangement that additional devices and auxiliary means are necessary which, particularly in case of coils of large dimensions, means substantial added expense. Further, during this stretching process, changes in the coil geometry may occur which can lead to a significant deterioration in the quality, because in air-core coils the field geometry in the superconducting range is determined exclusively by the coil geometry.

SUMMARY OF THE INVENTION

It is an object of the invention to provide an improved method by means of which the number of the training steps performed on a superconducting coil can be substantially reduced, including the total elimination thereof and further, no expensive auxiliary equipment is needed for stretching the coil.

This object and others to become apparent as the specification progresses, are accomplished by the invention, according to which, briefly stated, the superconducting wire, prior to forming a coil therefrom by winding, is submitted to repeated tension-stressing of a predetermined stretch in a predetermined number of cycles.

The particular advantages achieved by the invention reside in that no separate measures have to be taken with regard to the construction of the superconducting coils and further, the number of the training steps can nevertheless be substantially reduced.

DESCRIPTION OF THE PREFERRED EMBODIMENTS

Figure 1:
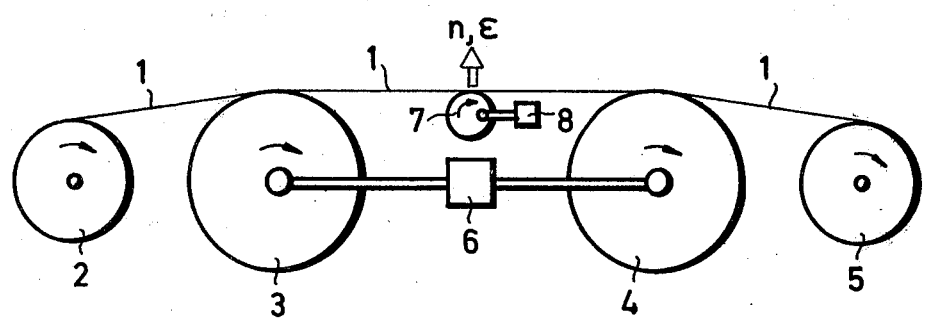
FIG. 1 is a schematic side elevational view of an apparatus for the cyclic stretching of long superconducting wires.

In the apparatus shown in FIG. 1, designed for treating conductors of substantial length, a superconductor 1 which is subsequently to be wound to constitute a coil, is drawn from a supply reel 2. The superconductor 1 is looped at least once about a first guide drum 3 and, in a pretensioned condition, is looped at least once about a second guide drum 4 and is thereafter received by a take-up reel 5. The first and second guide drums 3 and 4 are positively coupled to one another by means of a device 6 for synchronizing their rotary speed. Between the two guide drums 3 and 4 there is arranged an eccentrically supported disc 7 which is rotated by a motor 8 and which is so arranged and coupled to the tensioned superconductor 1 that the latter is submitted to a cyclic tension-stressing of a predetermined stretch $\epsilon$ and a predetermined number of stretches (number of cycles) n.

Figure 2:
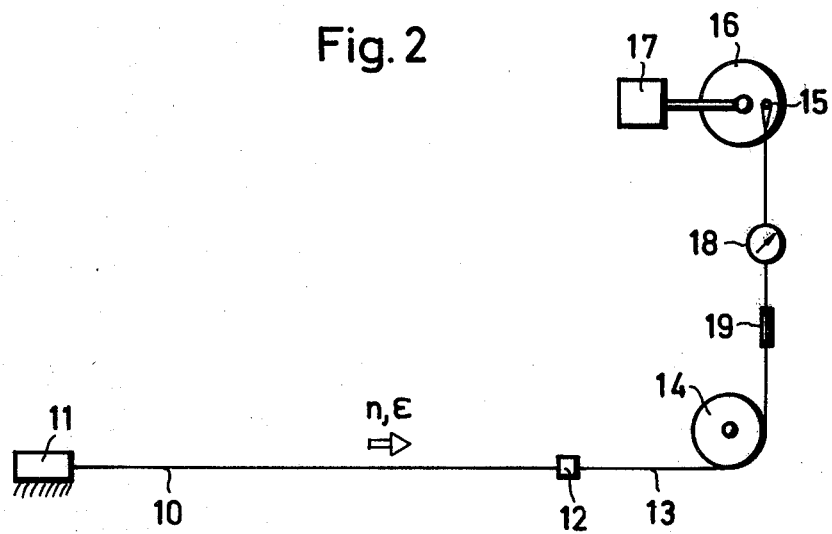
FIG. 2 is a schematic side elevational view of an apparatus fo the cyclic stretching of short superconducting wires.

The apparatus illustrated in FIG. 2 is particularly adapted to submit relatively short superconducting wires 10 to a cyclic tension stress of a predetermined stretch $\epsilon$ and a predetermined number of cycles n. The superconducting wire 10 is firmly clamped at one end into a clamping device 11 and is connected to a drawing cable 13 at its other end by means of a clamp 12. The cable 13 is guided about a pulley 14 and is, at its free end, connected to a pin 15 which, in turn, is mounted on a disc 16. The disc 16 is rotated by a motor 17. The magnitude of the pretension of the superconductor 10 is settable by means of a force-measuring gauge 18 and a turnbuckle 19 so that when the disc 17 is rotated, predetermined intermittent tensioned forces are applied to the superconductor 10 submitting the latter to a tension stress of a predetermined stretch $\epsilon$ and a predetermined number of cycles n.

EXAMPLE 4.70 m long NbTi 50 superconducting wires of 1.45 mm diameter formed of 1700 filaments of $20\mu$ diameter each and embedded in a copper matrix at a ratio of NbTi:Cu=1:2 were treated at room temperature by the method according to the invention and in an apparatus as described above. The superconducting wires were exposed to stretches $\epsilon=0.75\%$, $\epsilon=0.5\%$ and $\epsilon=0.25\%$ at a number of cycles n from 0 to 200. Subsequently, the superconductors treated in this manner were wound with identical winding data to form test coils which then were trained in the same manner.

In a coordinate system (not shown) in which the abscissa represents the numer of training steps and the ordinate represents the current intensity a line is drawn parallel to the abscissa through the value of critical current intensity value Ic. The current intensity at which the coil passes from the superconducting state to the normally conducting state, in successive training steps is plotted in this same coordinate system over the corresponding training step number. This curve, the ordinate and critical current intensity value line Ic of the particular wire enclose an area which can be represented by a valuation number that is proportionate to such an area. Thus, the smaller the valuation number, the smaller the number of training steps necessary to bring the current intensity up to the desired critical value Ic.

Figure 3:
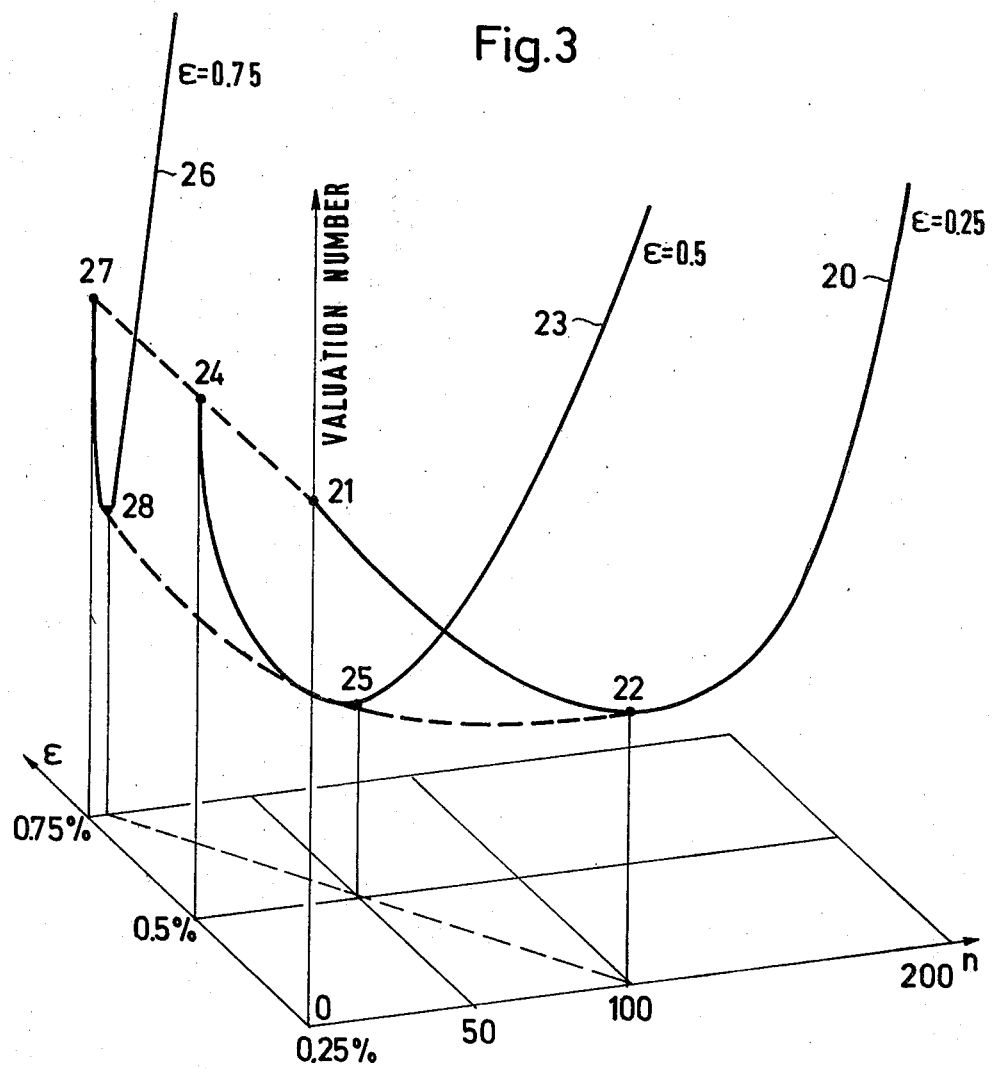
FIG. 3 is a diagram illustrating the effectiveness of the number of load applications (cycles) and the stretch of the superconductor.

Turning now to FIG. 3, there is shown a space coordinate system having a first coordinate for the stretch $\epsilon$ measured in % of elongation of the superconductors, a second coordinate for the cycle number n and a third coordinate for the valuation number.

The curve 20 relates to the test wires submitted to $\epsilon=0.25\%$. The curve 20 which thus lies approximately in the plane of the drawing, drops from the point 21 at a cycle number $n=0$ continuously until it reaches a point 22 (minimum valuation number) at $n=100$ and thereafter again steeply increases with increasing n. The curve 23 for $\epsilon=0.50\%$ drops continuously from the point 24 where $n=0$ to point 25 (minimum valuation number) where $n=50$ and then again increases as n increases. Similar course is assumed also by the curve 26 for $\epsilon=0.75\%$ which, starting from point 27 at $n=0$, reaches point 28 of minimum valuation number already at $n=10$. A large cycle number n at small stretches $\epsilon$ of the superconductor thus leads to the same result as a small cycle number n at larger stretches $\epsilon$.

The diagram of FIG. 3 thus demonstrates that the method for treating superconducting wires according to the invention results in a reduction of the training steps necessary to bring up the current intensity (at which transition from the superconducting state to the normally conducting state occurs) to the predesigned critical current intensity Ic. It is noted that the described tension-stressing of the wire according to the invention raises the internal stresses in the superconducting wire during the pretreatment from the value for an externally nonstressed conductor to above a level that is anticipated to be developed in the wire in the presence of the expected electromagnetic force generated by the superconducting coil during its normal operation. The tension-stressing of the superconducting wire will usually be performed at roomtemperature. But there may be certain types of wire, that are prestressed at $LN_2$-temperature or even at LHe-temperature with a better effect.

It is to be understood that the above description of the present invention is susceptible to various modifications, changes and adaptations, and the same are intended to be comprehended within the meaning and range of equivalents of the appended claims.

What is claimed is:

1. In a method of making a superconducting coil from a superconducting wire, including the step of winding the wire to form a coil, the improvement comprising the step of submitting said wire, prior to the winding step, to repeated tension-stressing of a predetermined stretch and a predetermined number of cycles.

2. A method as defined in claim 1, further comprising the step of maintaining said wire, during the tension-stressing step, at a predetermined temperature set as a function of the material of the wire and the critical current intensity designed for the superconducting coil.

3. A method as defined in claim 1, further comprising the step of maintaining said wire at room temperatures during the tension-stressing step.

* * * * *